United States Patent [19]

Dayem et al.

[11] 4,242,419
[45] Dec. 30, 1980

[54] EPITAXIAL GROWTH OF SUPERCONDUCTORS SUCH AS NB₃GE SUPERCONDUCTORS

[75] Inventors: Aly H. Dayem, Colts Neck, N.J.; Theodore H. Geballe, Woodside, Calif.; Chandra K. N. Patel, Summit; Ping K. Tien, Chatham Township, Morris County, both of N.J.

[73] Assignee: Bell Telephone Laboratories, Incorporated, Murray Hill, N.J.

[21] Appl. No.: 865,510

[22] Filed: Dec. 29, 1977

[51] Int. Cl.² ............................................. H01B 1/02
[52] U.S. Cl. .................................... 428/661; 428/662; 427/62; 29/599; 148/11.5 R; 252/512; 252/514; 252/516
[58] Field of Search .................... 29/599; 148/11.5 R, 148/11.5 F; 156/DIG. 87, 610, 614; 427/62; 428/662, 661; 252/512, 518, 514, 16

[56] References Cited

U.S. PATENT DOCUMENTS

| 3,506,940 | 4/1970 | Corenzwit et al. | 335/216 |
| 3,824,082 | 7/1974 | Vieland et al. | 29/599 |
| 4,043,888 | 8/1977 | Gavaler | 427/62 X |
| 4,128,121 | 12/1978 | Sigsbee | 427/62 X |
| 4,129,166 | 12/1978 | Sigsbee | 427/62 X |
| 4,129,167 | 12/1978 | Sigsbee | 427/62 X |

OTHER PUBLICATIONS

Applied Physics Letters, vol. 29, No. 5, Sep. 1, 1976, "Synthesis and Stability of Nb₃Ge made by Electron-Beam Codeposition", pp. 314-316.
Physical Review B, vol. 12, No. 11, Dec. 1, 1975, "Phenomenological Approach to High-Transition Temperature Superconducting Alloys", pp. 4816-4824.
Physical Review, vol. 139, No. 5A, Aug. 30, 1965, "Superconductivity of Nb₃GE", pp. 1501-1503.

Primary Examiner—Benjamin R. Padgett
Assistant Examiner—E. Suzanne Parr
Attorney, Agent, or Firm—Richard D. Laumann

[57] ABSTRACT

Nb₃Ge, Nb₃Al and Nb₃Si are prepared in A15 structures at the exact stoichiometric ratio with epitaxial growth on selected substrates. The phase diagrams of the materials are altered by this technique and only the A15 phase is stable at the stoichiometric ratios thus permitting attainment of higher and sharper transition temperatures.

6 Claims, 5 Drawing Figures

EPITAXIAL GROWTH OF SUPERCONDUCTORS SUCH AS NB₃GE SUPERCONDUCTORS

BACKGROUND OF THE INVENTION

1. Field of the Invention

This invention relates to superconducting materials and to a method of preparing such materials by epitaxial growth.

2. Description of the Prior Art

Superconductivity, a thermodynamic state characterized by zero electrical resistivity and perfect diamagnetism, was discovered in 1911 by Kammerlingh Onnes at Leiden University when he found that the resistance of mercury vanished below 4.2 degrees K. Although it was subsequently found that numerous other elements, alloys and compounds are superconductors when cooled to sufficiently low temperatures, it was also discovered that, even if the temperature was below the critical or transition temperature, superconducting properties could be destroyed by a sufficiently strong magnetic field which might be either an external field or one associated with the superconducting current. Commercial interest in the first discovered superconducting materials soon waned because even moderate magnetic fields destroyed the superconducting properties and superconducting properties were thus limited to low magnetic fields and currents.

Upon the discovery of what is now referred to as hard, or Type II superconductivity, the entire field advanced and revived commercial interest. Type II superconductors are often characterized by, among other anomalous properties, high transition temperatures and high critical magnetic fields and although they may have any one of several crystal structures, they are best exemplified by the A15 or beta-wolfram structure. The discovery of $Nb_3Sn$ by Matthias, Geballe, Geller and Corenzwit in 1954 and the further discovery by Kunzler and coworkers of its unexpectedly high critical magnetic field established benchmarks which are still typical of the commercially promising high $T_c$ superconductors and are easily sufficient to justify the extensive studies during recent years directed toward commercial exploitation of superconductors. Commercial uses suggested include very high magnetic field devices used as magnetic containers for high temperature plasmas in fusion power sources or as magnets for bubble chambers or high energy elementary particle accelerators. Although much effort was directed towards studying $Nb_3Sn$, investigation of other materials having the A15 structure also proceeded.

Possibly the most significant advance in the latter respect was the discovery by Matthias and Geballe and their coworkers, U.S. Pat. No. 3,506,940, that an alloy of $Nb_3Ge$ and $Nb_3Al$ had a transition temperature higher than any known at that time including $Nb_3Sn$. This tended to support the thesis that $Nb_3Ge$ is probably, from the standpoint of the parameters of concern, the most valuable of the studied A15 materials. Based on this and other studies which indicated that the maximum transition temperature of $Nb_3Ge$ would occur at the stoichiometric composition, it was generally accepted that if $Nb_3Ge$ were available as a pure A15 material, it would supersede $Nb_3Sn$ for many purposes. Efforts made to produce $Nb_3Ge$ in the desired structure have resulted in advances and identification of directions for fruitful exploration.

For example, a metastable A15 phase in $Nb_xGe_y$ films has been prepared by electron beam codeposition at an oxygen partial pressure of $2 \times 10^{-6}$ Torr on a substrate held at 775 degrees C. during deposition. This technique extends the A15 phase boundary to about 23 atomic percent Ge. The A15 $Nb_3Ge$ structure obtained, competing with the stable $Nb_5Ge_3$, is, however, extremely sensitive to nucleation conditions, contamination, deposition rate and the substrate temperature. Thermodynamic considerations that favor formation of phases other than the A15 at the stoichiometric composition are the primary reason for the lack of success in preparing $Nb_3Ge$ in a pure A15 structure at the stoichiometric composition.

It was also generally accepted that other materials, such as $Nb_3Al$ and $Nb_3Si$, would have their maximum transition temperatures, and have increased commercial value, if they could be prepared in a pure A15 phase at the stoichiometric composition. Thermodynamic considerations similar to those described for $Nb_3Ge$ cause phases other than the A15 to also be stable at the stoichiometric composition and have prevented preparation of the desired materials.

SUMMARY OF THE INVENTION

It has been found that epitaxial growth of superconductors on suitable substrates alters the phase diagram of the superconductor and allows the formation of desired phases at the stoichiometric composition. The substrate and the desired phase should have the same crystal structure and approximately matching, normally within plus or minus 0.04 Angstroms, lattice constants. Superconducting bodies, such as magnets, can be formed from the compositions.

For example, $Nb_3Ge$, $Nb_3Al$ and $Nb_3Si$ can be prepared in a perfect A15 structure at the stoichiometric compositions by epitaxial growth of the compositions on A15 substrates having lattice constants matching that of the desired phase within plus or minus 0.01 Angstroms. In a preferred embodiment, $Nb_3Ge$ is grown on an $Nb_3Ir$ substrate.

DETAILED DESCRIPTION

Figure 1:
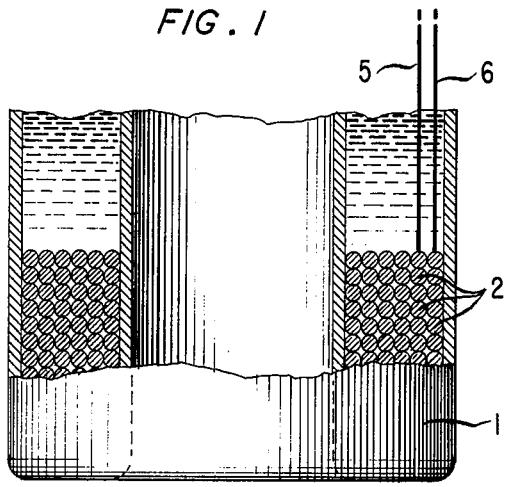
FIG. 1 is a sectional view of a magnetic configuration consisting of an annular cryostat containing a plurality of windings of a superconducting material such as $Nb_3Ge$.

Referring specifically to FIG. 1, an annular cryostat 1 with approximate dimensions 18 inches outer diameter, 6 inches inner diameter and 30 inches long, filled with coolant and containing 2,000 turns per centimeter length of windings 2 is depicted. Windings 2 are made from a superconducting material having a critical temperature and may be on a substrate as well as insulated by, e.g., a thin coating of copper which also serves to protect the superconducting winding if it should return to its normal state by acting as an electrical shunt. Terminal leads 5 and 6 are shown emerging from the coil. A pumping means, not shown, may be attached to the cryostat to permit a temperature variation resulting from a concomitant variation in boiling point of, for example, liquid helium as the pressure varies. Variations in magnetic configurations may be made in accordance with well-known and established practice depending upon the ultimate intended use.

It has been found that epitaxial growth of superconductors on selected substrates alters the phase boundaries so that desired phases can be grown at stoichiometric compositions and will be thermodynamically stable. The substrate and desired phase should have the same phase and approximately matching lattice constants, normally within plus or minus 0.04 Angstroms. As examples, the boundary of the stable A15 phase can be extended to at least the stoichiometric composition for $Nb_3Ge$, $Nb_3Al$ and $Nb_3Si$, and mixtures thereof.

Growth on a substrate having the same crystal structure and a lattice constant matching that of the phase whose growth is desired should result in the Gibbs-free energy of the material grown being a minimum if the overgrowth lattice matches that of the substrate. With these growth conditions, nucleation and growth of the competing and unwanted phases are less energetically favorable than growth of the desired phase which matches the substrate parameters. When the free energy minima are sufficiently altered by such epitaxial growth, the A15 phase boundary extends to or beyond 25 atomic percent Ge, Al or Si and allows formation of stoichiometric $Nb_3Ge$, $Nb_3Al$ or $Nb_3Si$ in a pure A15 phase. An another example, the B1 phase boundary can be extended beyond 50 atomic percent C and stoichiometric NbC and VC, and mixtures thereof, can be formed in a pure B1 phase.

An exemplary embodiment, the growth of $Nb_3Ge$, will be described in some detail with the understanding that appropriate modifications, in accordance with the general considerations given, are made when growing other materials. This superconducting material may be epitaxially grown on a single crystal substrate having an A15 structure with a lattice constant matching, within plus or minus 0.01 Angstroms, that of the superconducting material. An alternative is the use of a polycrystalline thin film of a material having an A15 structure and a matching lattice constant, as previously defined, as a substrate. As the latter growth technique is perhaps of more general utility and less easily understood than the former, it will be described in detail.

The term epitaxy as used here refers to growth on polycrystalline, as well as single crystal, substrates.

The initial deposit is forced to be related epitaxially to the substrate to minimize the free energy and, consequently, growth conditions of the desired $Nb_3Ge$ A15 phase are more favorable than those of the competing second phase, or phases, at the stoichiometric composition. If the presence of the matching substrate sufficiently reduces the free energy of the desired phase, growth of the unwanted second phase or phases will be completely suppressed. The polycrystalline substrates are typically grown on highly polished carriers, such as sapphire, prepared with conventional techniques. Other carrier materials such as carbon, fused quartz or silicon might also be used.

A particularly convenient and well-known method, electron beam coevaporation, of epitaxially growing the materials, both substrate and superconducting $Nb_3Ge$, will be described in some detail although other methods, such as sputtering, might also be used. The substrate and superconducting material were grown on a sapphire carrier. Two separately controllable electron guns were used. One activated a fixed Nb source, while the other activated a Ge, Si or Al, Ir or Rh source. The latter sources are placed in separate crucibles located on a rotating table to permit convenient selection of the desired crucible and material. The sapphire carriers were held at 875±10 degrees C. during evaporation using a temperature controlled oven. The growth rate was between 12 and 20 Angstroms/sec. The growth rate chosen is not crucial but rates faster than 20 Angstroms/sec. make attainment of equilibrium on the surface difficult. At higher temperatures, adhesion becomes a problem. The substrate and superconducting material should be at least 0.5 μm thick but there is no upper limit to the thickness.

After termination of growth, electron microprobe analysis was used to determine the composition of the film to an accuracy of approximately ±1 atomic percent. The lattice constants were determined from X-ray diffractometer traces. The diffraction patterns were recorded on photographic films using a Reed diffraction camera and the photographs were used in well known manner to determine any preferred orientation and the number of crystalline phases present. The superconducting transition temperature was simultaneously measured with standard inductive and resistive techniques to an accuracy of ±0.2 degrees K.

EXAMPLE 1

A polycrystalline $Nb_xIr$ film grown on sapphire was used as a substrate for growing $Nb_3Ge$. x represents the variation in composition of the Nb-Ir binary system over the range of interest. Both the $Nb_3Ge$ and the $Nb_xIr$ layers were approximately 0.5 μm thick.

$Nb_xIr$ films on sapphire: The A15 structure in the Nb-Ir binary system extends over the range 21.5–28.5 atomic percent Ir and electron beam coevaporation in the manner previously described of Nb and Ir on a sapphire carrier held at 875 degrees C. resulted in polycrystalline $Nb_xIr$ films with a pure A15 structure. The $Nb_xIr$ lattice constant varies between 5.125 angstrom units and 5.169 angstrom units as the atomic percent of Ir varies within the range of interest between 28 percent and 20 percent and is thus well-suited for the epitaxial growth of $Nb_3Ge$ which should have a lattice constant of approximately 5.135 angstrom units at the stoichiometric composition if extrapolation from thermodynamic equilibrium is valid.

Epitaxial Growth of $Nb_xGe$ on $Nb_xIr$: $Nb_xGe$ was grown, as described by electron beam coevaporation, on $Nb_xIr$ substrates. Samples were grown with different $Nb_xIr$ compositions of which some were designed to expand and some to contract the $Nb_xGe$ lattice constant.

Figure 2:
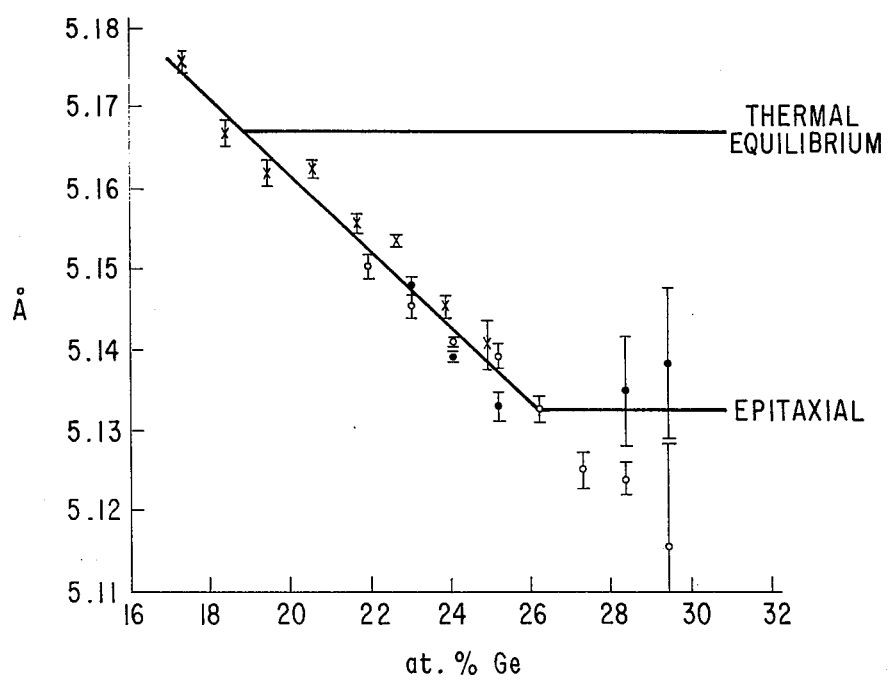
FIG. 2 shows experimentally measured lattice constants of $Nb_xGe$ epitaxially grown on polycrystalline $Nb_xIr$ versus atomic percent of Ge.

FIG. 2 shows the experimentally measured lattice constants for the $Nb_xGe$ compositions grown on $Nb_xIr$. The different signs used for the experimental points represent, as also in FIGS. 3, 4 and 5, measurements on different samples. It is evident that the $Nb_xGe$ lattice neither expanded nor contracted but, within experimental errors, grew with its natural lattice constant as obtained from a straight line extrapolation of the bulk equilibrium value. The $Nb_xGe$ lattice constant is not sensitive, within the limits previously given, to the $Nb_xIr$ lattice constant. It is also apparent that the boundary of the A15 phase has been extended from 19 atomic percent to approximately 26 atomic percent Ge. The presence of the $Nb_xIr$ film having an A15 phase has caused the free energy of the $Nb_xGe$ system to minimize by forming a pure A15 phase. The observed linear variation in lattice constant is typical of the equilibrium range of a given phase.

Figure 3:
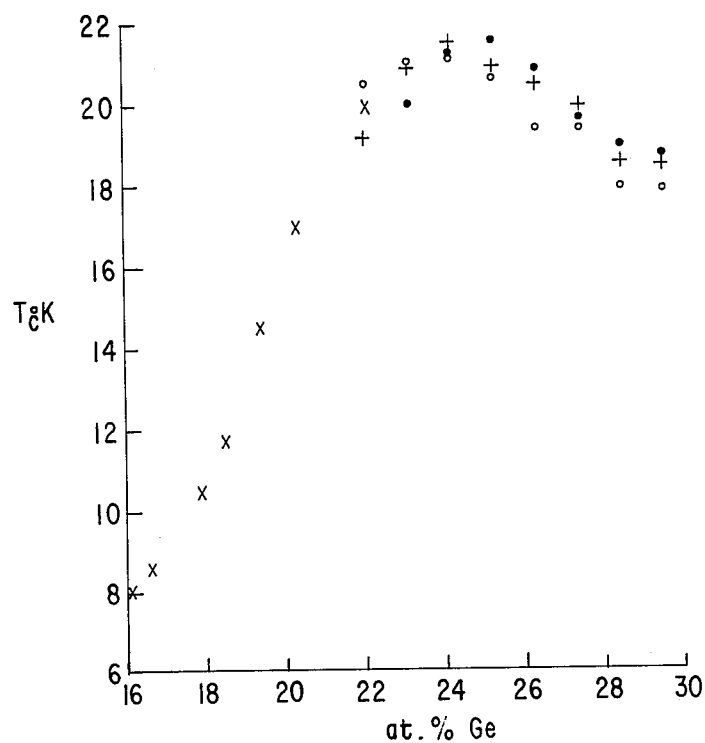
FIG. 3 is a plot of the transition temperature and width as a function of atomic percent of Ge for $Nb_xGe$ samples epitaxially grown on $Nb_xIr$.

The effect of the epitaxial growth, and the presence of the A15 phase at the stoichiometric composition, on the transition temperature is shown in FIG. 3 which plots the $T_c$ onset temperature of $Nb_xGe$ versus atomic percent Ge. The maximum transition temperature occurs around 25 atomic percent Ge where a minimum in transition width of about 0.9 degrees K. also occurs. Transition temperatures in excess of 20 degrees K. are easily obtained. Neither the lattice constant nor $T_c$ is particularly sensitive, within plus or minus 0.01 Angstroms, to the $Nb_xIr$ lattice constant.

EXAMPLE 2

A polycrystalline $Nb_xRh$ film grown on sapphire was used as a substrate for growing $Nb_3Ge$. x represents the variation in composition of the Nb-Rh binary system over the range of interest. Both the $Nb_xGe$ and $Nb_xRh$ layers were approximately 0.5 $\mu$m thick.

$Nb_xRh$ films on sapphire: The $Nb_xRh$ system is more complicated than the $Nb_xIr$ system. In the composition range of interest, extending from 24 to 32 atomic percent Rh, X-ray diffractometer traces indicate that the $Nb_xRh$ films generally contain three phases including an A15 structure with a lattice constant that varies between 5.13 Angstrom units and 5.09 Angstrom units.

Figure 4:
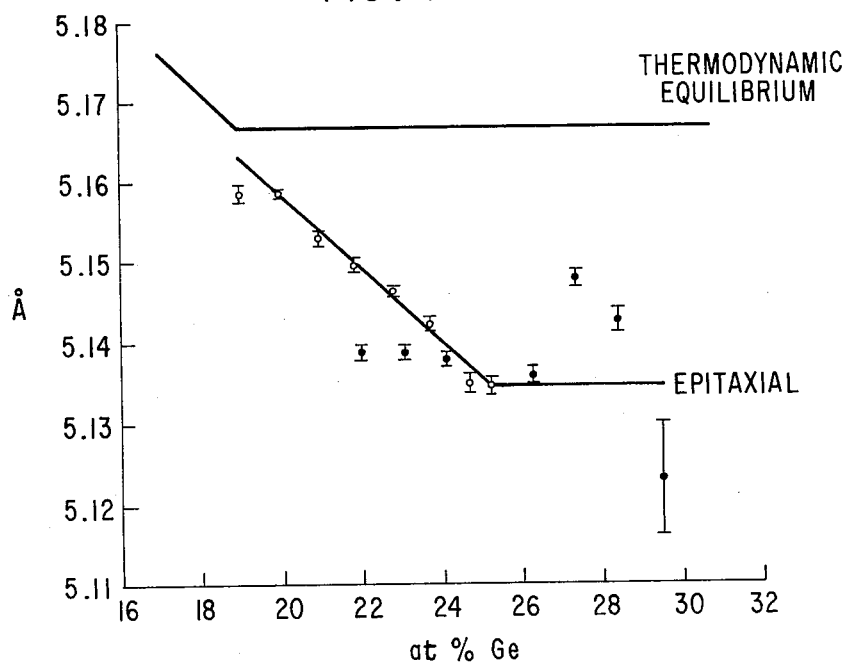
FIG. 4 shows experimentally measured lattice constants of $Nb_xGe$ epitaxially grown on polycrystalline $Nb_xRh$ versus atomic percent of Ge.

Epitaxial Growth of $Nb_xGe$ on $Nb_xRh$: Samples were prepared by electron beam coevaporation, as previously described, with $Nb_xRh$ deposited at 400 degrees C. on a sapphire substrate. The substrate temperature was raised to 875 degrees C. prior to the deposition of $Nb_xGe$. The lattice constants for these $Nb_xGe$ compositions grown on $Nb_xRh$ versus atomic percent Ge are shown in FIG. 4 and it is apparent that the boundary of the $Nb_xGe$ A15 phase has been extended to approximately 25 atomic percent Ge. The values of the lattice constants are, however, approximately 0.0035 Angstrom units smaller than the extrapolated equilibrium values.

Figure 5:
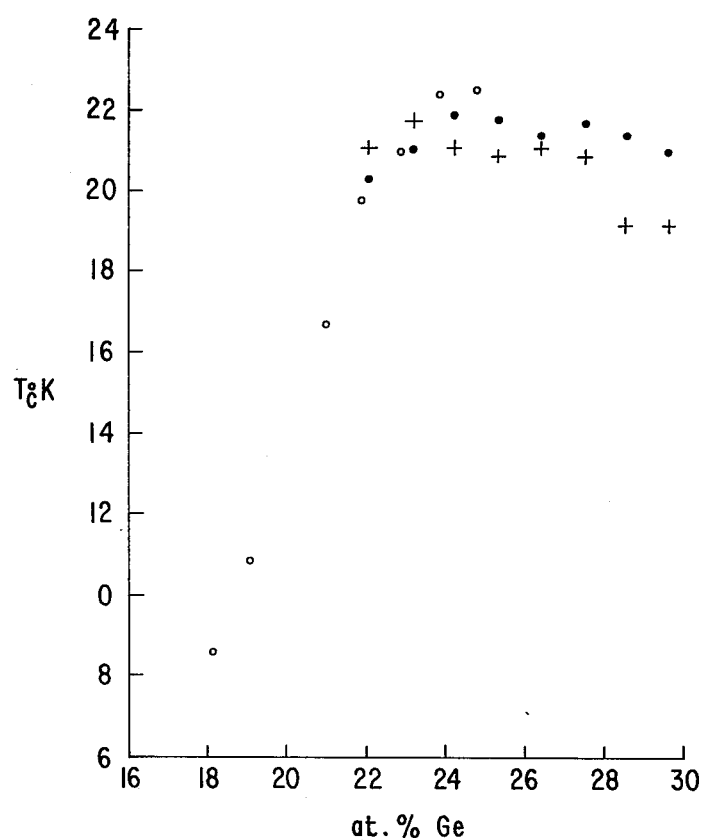
FIG. 5 is a plot of transition temperature as a function of atomic percent of Ge for $Nb_xGe$ samples epitaxially grown on $Nb_xRh$.

FIG. 5 plots the $T_c$ onset temperature as a function of atomic percent Ge for the $Nb_xGe$ samples epitaxially grown as described on $Nb_xRh$ substrates. The peak transition temperature appears to be in the vicinity of 24 atomic percent Ge. The transition temperatures obtained are comparable to those obtained on $Nb_xIr$ substrates although the transition widths are about three times larger than for the compositions prepared on $Nb_xIr$. The good results obtained on a substrate containing a mixture of phases including the A15 illustrates that the substrate may contain several phases only one of which need match, with respect to type and lattice constant, that of the material grown.

The techniques described can also be used to prepare $Nb_3Al$ and $Nb_3Si$ in a pure A15 structure at their stoichiometric compositions. Suitable substrates for $Nb_3Al$ and $Nb_3Si$ are $Nb_3Pt$ and $Ti_3Au$, respectively. Additionally, mixtures, such as $Nb_3Ge_xAl_{1-x}$, x between 0 and 1, of the described compositions may be epitaxially grown on suitable substrates.

Additional superconducting materials that may be grown with the method described include NbN and $Nb_xV_{1-x}C$, x between 0 and 1, which may be grown on a silicon carbide substrate.

What is claimed is:

1. A superconducting body comprising a substrate; and a composition having a phase and a stoichiometric composition, said composition having a lattice constant, characterized in that said composition is epitaxially grown on a substrate having a lattice constant matching that of said composition within plus or minus 0.04 Angstroms; said composition is selected from the group consisting of $Nb_3Ge$, $Nb_3Al$, $Nb_3Si$ and mixtures thereof. NbN and $Nb_xV_{1-x}C$, x between 0 and 1; said substrate being selected from the group consisting of $Nb_xIr$, $Nb_xRh$, $Nb_3Pt$, $Ti_3Au$ and SiC.

2. A body as recited in claim 1 in which said lattice constants match within plus or minus 0.01 Angstroms.

3. A body as recited in claim 2 in which said substrate is a niobium containing composition.

4. A body as recited in claim 3 in which said composition is $Nb_3Ge$ and said substrate consists essentially of a composition selected from the group consisting of $Nb_xIr$ and $Nb_xRh$.

5. A body as recited in claim 4 in which said substrate composition is $Nb_xIr$ and in which said substrate has a lattice constant between 5.169 Angstrom units and 5.125 Angstrom units.

6. A body as recited in claim 4 in which said substrate composition is $Nb_xRh$ and in which said substrate has a lattice constant between 5.13 Angstrom units and 5.09 Angstrom units.

* * * * *